United States Patent [19]
Lewis et al.

[11] Patent Number: 5,308,447
[45] Date of Patent: May 3, 1994

[54] ENDPOINT AND UNIFORMITY DETERMINATIONS IN MATERIAL LAYER PROCESSING THROUGH MONITORING MULTIPLE SURFACE REGIONS ACROSS THE LAYER

[75] Inventors: Russell E. Lewis, Cupertino; Richard E. Howard, Pleasanton; Herbert E. Litvak, Cupertino, all of Calif.

[73] Assignee: Luxtron Corporation, Santa Clara, Calif.

[21] Appl. No.: 896,132

[22] Filed: Jun. 9, 1992

[51] Int. Cl.$^5$ .................................... G01N 21/00
[52] U.S. Cl. .................... 156/626; 156/640; 427/9; 427/10
[58] Field of Search .............. 156/626, 627, 640; 204/129.2, 192.33, 192.13, 298.32; 427/9, 10

[56] References Cited

U.S. PATENT DOCUMENTS

| | | | |
|---|---|---|---|
| 4,496,425 | 1/1985 | Kuyel | 156/626 |
| 4,611,919 | 9/1986 | Brooks, Jr. et al. | 156/626 X |
| 4,859,277 | 8/1989 | Barna et al. | 156/626 |
| 5,002,627 | 3/1991 | Scheithauer et al. | 156/626 X |
| 5,147,520 | 9/1992 | Bobbio | 156/345 X |

FOREIGN PATENT DOCUMENTS

| | | | |
|---|---|---|---|
| 60-35519 | 2/1985 | Japan | 156/627 |
| 62-8525 | 1/1987 | Japan | 204/298.32 |

OTHER PUBLICATIONS

XINIX Product Brochure, entitled "Wet Process Endpoint Controller, 2200 Single Station" (Jun. 1989).
XINIX Product Brochure, entitled "Wet Process Endpoint Controller, 2300-2400" (Jun., 1990).

*Primary Examiner*—Thi Dang
*Attorney, Agent, or Firm*—Majestic, Parsons, Siebert & Hsue

[57] ABSTRACT

Techniques of monitoring and controlling removal or forming of layers of material, such as employed in the manufacture of flat panel displays and integrated circuit wafers. Examples of material removal include the development of a photoresist layer and etching of layers of other material according to a pattern across the surface of the layer. The material removal process is terminated in response to detecting when breakthrough occurs in a preselected number of individual regions across the surface of the layer. A measure of uniformity of processing across the layer surface is obtained from monitoring removal of material in such individual surface regions, and can be used to control the process to improve such uniformity.

34 Claims, 4 Drawing Sheets

ENDPOINT AND UNIFORMITY DETERMINATIONS IN MATERIAL LAYER PROCESSING THROUGH MONITORING MULTIPLE SURFACE REGIONS ACROSS THE LAYER

BACKGROUND OF THE INVENTION

This invention relates generally to process control, and, more specifically, to the processing of a layer through a surface thereof under conditions where either the layer or the processing, or both, is uneven across the surface.

There are many situations where such processing takes place. One class of such situations occurs in the manufacturing of flat panel liquid crystal displays and integrated circuits on semiconductor wafers. In each, several processing steps include forming a layer of material and subsequently removing either all or a portion of the layer according to a pattern. Uniformity of the forming and removing operations is important, primarily because of the extremely small variations that are allowed in the finished products. As part of this process, it must be accurately determined when just enough of the layer has been removed; ie, to detect an endpoint of the removal operation. The endpoint determination is then used to monitor the progress of the process and/or to control the process, such as by automatically terminating the specific processing operation being monitored.

At several stages in the manufacture of display panels or circuits on a semiconductor wafer, a mask is formed of photoresist material. The resulting mask is used to limit processing of a layer covered by the mask to a patterned area. The mask is formed by exposing the photoresist layer to light in the desired pattern, followed by developing the photoresist layer through application of a developer solution to it. With the usual photoresist material, the exposed regions are removed during the development process to expose the layer below. The time at which the underlying layer first becomes exposed by removal of photoresist material is termed the "breakthrough" or "endpoint." The development process is allowed to continue for a period of time after breakthrough is first detected, the end of that period of time being the end of the development process, termed its "process end" (or "step end" if there is more than one step in the overall process).

Because of various processing and environmental variations that exist among semiconductor wafers, the development process is monitored in order to determine when breakthrough occurs. A beam of light having a finite bandwidth is directed against the photoresist layer of one wafer and a reflected or transmitted light signal is then detected in, the resulting electrical signal processed to determine when breakthrough occurs. In one form, light reflected from both the top and bottom surfaces of the substantially transparent photoresist layer interferes at, and is detected by, a photodetector. As a portion of the photoresist layer is removed during the development process, the detected intensity of the reflected light cycles between one or more maxima and minima as the material removal alters the relative phase between the two interfering beams. At breakthrough, however, this signal variation ends, a condition which is detected by analyzing the photodetector output signal. Development is then usually allowed to proceed for a fixed or calculated time after detection of breakthrough, at which point the development is terminated by rinsing away the development solution or by some other means.

Wet etching processes, wherein substantially transparent material layers other than photoresist material are etched away, also use a similar breakthrough detection process. Where the layer being etched is opaque, the photodetector signal either suddenly rises or falls when breakthrough occurs. In the case of a dry etching process, wherein material is removed by bombardment in a plasma chamber, a species within the plasma is monitored by detecting the emission of light in a limited wavelength band that shows material is being removed from the layer being etched. The detected signal in a plasma application drops off considerably at breakthrough. These sudden changes that occur at breakthrough are also detectable.

It is an object of the present invention to provide improved techniques of monitoring and controlling these and characteristically similar types of processing operations.

It is another object of the invention to provide a technique of monitoring and controlling the uniformity of such processing across surface areas being treated.

It is a special object of the present invention to provide an improved method of manufacturing with an improved yield large flat liquid crystal display panels.

SUMMARY OF THE INVENTION

This and additional objects of the present invention are accomplished, according to one aspect, briefly and generally, by monitoring in two or more regions of a surface of an article being processed the effect of a given processing step and then terminating that processing step when it is determined that it has been completed in a predetermined number of monitored regions. In some processes, it is desired to wait until the processing is complete in all of the monitored regions before the step is terminated. In other operations, it is desired to terminate the processing step as soon as it is determined that the processing has been completed in any one of the monitored regions. In situations where the processing is being monitored in a larger number of regions, such as four or more, the processing step can be terminated when it is determined that it has been completed in some preset specific number of regions being monitored.

According to another aspect of the present invention, a spread in times in detecting that processing within the monitored regions has been completed is used as an indication of uniformity of the processing step across the article containing the regions being monitored. That indication is directly usable to control the processing step to improve uniformity, by adjusting parameters of the same processing step for the next article in order to improve its uniformity, by adjusting processing parameters of a subsequent step on the same article in order to compensate for any major non-uniformity, and by adjusting processing parameters of a previous step so that subsequent articles are more uniform when they reach the processing step that is being monitored.

These processing techniques are particularly useful in treating a large surface area of a number of articles wherein the treatment is monitored at several substantially non-overlapping small areas or regions across the article surface being treated. One example of such a surface is one exposed across a flat panel display or large integrated circuit wafer that is being processed according to usual semiconductor techniques. The particular step in the sequence of semiconductor processing steps where the process monitoring and control according to the present invention is particularly useful is in the photoresist developing and layer etching steps summarized in the preceding Background portion of this application.

Additional objects, features and advantages of the present invention will become apparent from the following description of its preferred embodiments, which description should be taken in conjunction with the company drawings.

DESCRIPTION OF THE PREFERRED EMBODIMENTS

Figure 1:
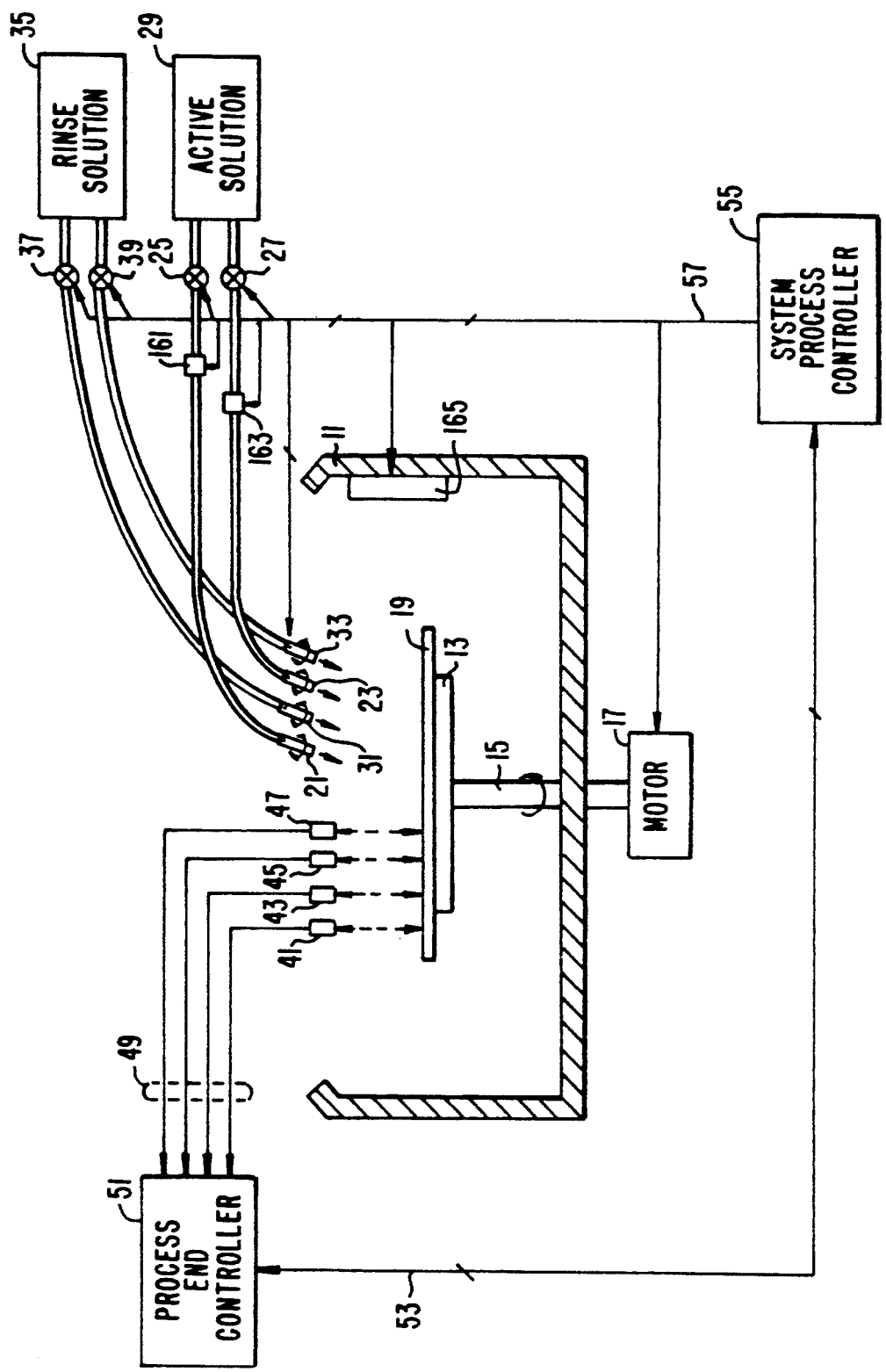
FIG. 1 schematically illustrates the use of one type of equipment to perform one process step in manufacturing a flat panel display or a large integrated circuit wafer.

Referring initially to FIG. 1, an example of an implementation of the present invention employs commonly used equipment for photoresist development as one step in a number sequential steps implemented to manufacture flat panel displays or electronic circuits on a large semiconductor wafer. A liquid enclosure 11 contains a support 13 that is rotated through a shaft 15 by a motor 17 positioned outside of the enclosure 11. A flat panel display or a semiconductor wafer 19 that is being processed is carried by the rotating support 13. At the point in the multi-step processing where the current step is being carried out, the photoresist layer has already been applied to the substrate structure and exposed to a light pattern corresponding to the physical pattern to be left after development. It is this physical mask pattern that is subsequently used in another step to etch the layer immediately beneath the photoresist layer.

A photoresist developer solution is generally applied to the photoresist layer by spraying, although other techniques can be used as well. In this case, two spray nozzles 21 and 23 are positioned at different distances from a center of rotation and over the article 19 being processed. Flow through each of the nozzles 21 and 23 is controlled by respective valves 25 and 27. The developer solution is stored in a container 29. Also positioned above the article 19 are two additional nozzles 31 and 33 for applying to the article 19 a rinse solution from a container 35 through respective valves 37 and 39.

The photoresist development begins by applying a developer solution from the nozzles 21 and 23, either intermittently or continuously, until it is detected by the technique described hereinafter that this development process has been completed, referred to as the "process end." At that point, further development is prevented by terminating application of fresh developer solution to the article 19 and rinsing off existing developer solution from the surface. Of course, any number of developer solution spray nozzles may be used as desired, two such nozzles 21 and 23 being illustrated in this example. Similarly, any number of rinse nozzles, from one to many, may be utilized, two such nozzles 31 and 33 being illustrated in this example.

In order to monitor the progress of the photoresist development taking place on the exposed surface of the article 19, several photodetectors are positioned above the article 19, in this case four photodetectors 41, 43, 45 and 47. These photodetectors are positioned at different distances from the center of rotation of the article 19 in order to receive light reflected from different regions of the article surface. Signals from the photodetectors 41, 43, 45 and 47 are connected through circuits 49 to a controller 51. A source of light reflected back into the photodetectors may be carried by each photodetector assembly itself, which is the case illustrated in FIG. 1, but, alternatively, can result from flooding the article 19 from a single light source in order that the various regions being monitored reflect light into the respective fields of view of the corresponding photodetectors. Other illumination schemes are of course possible. For certain types of processes and articles, light is preferably transmitted through the article 19 before striking the photodetectors, rather than being reflected from its surface as illustrated in FIG. 1.

The detected light signals from each of the photodetectors 41, 43, 45 and 47 are processed by the controller 51 in order to determine when the development process has resulted in removal of photoresist material in each of the regions being monitored to the point of a "breakthrough" of the layer. The controller 51 determines when the development has proceeded to breakthrough in each of the regions being monitored by the photodetectors. The controller 51 also, in a manner described hereinafter, chooses or calculates from those individual breakthrough times a single time which is then used as a basis for determining the time in which the process will be terminated such as by initiating a spray of the rinsing solution. This process end time is determined from the chosen breakthrough time by either adding a fixed time to the breakthrough time, adding a percentage of the process time of the breakthrough, or other similar type of technique. The calculated process end time is communicated over the bus 53 to a process controller 55. The process controller is an industrial control computer that generates control signals in circuits 57 for controlling operation of the motor 17, the liquid valve 25, 27, 37 and 39, and other normal machine control functions. In addition, other variables are controlled by the process controller 55 in order to improve uniformity of processing according to the present invention. These other functions are described below.

Figure 2:
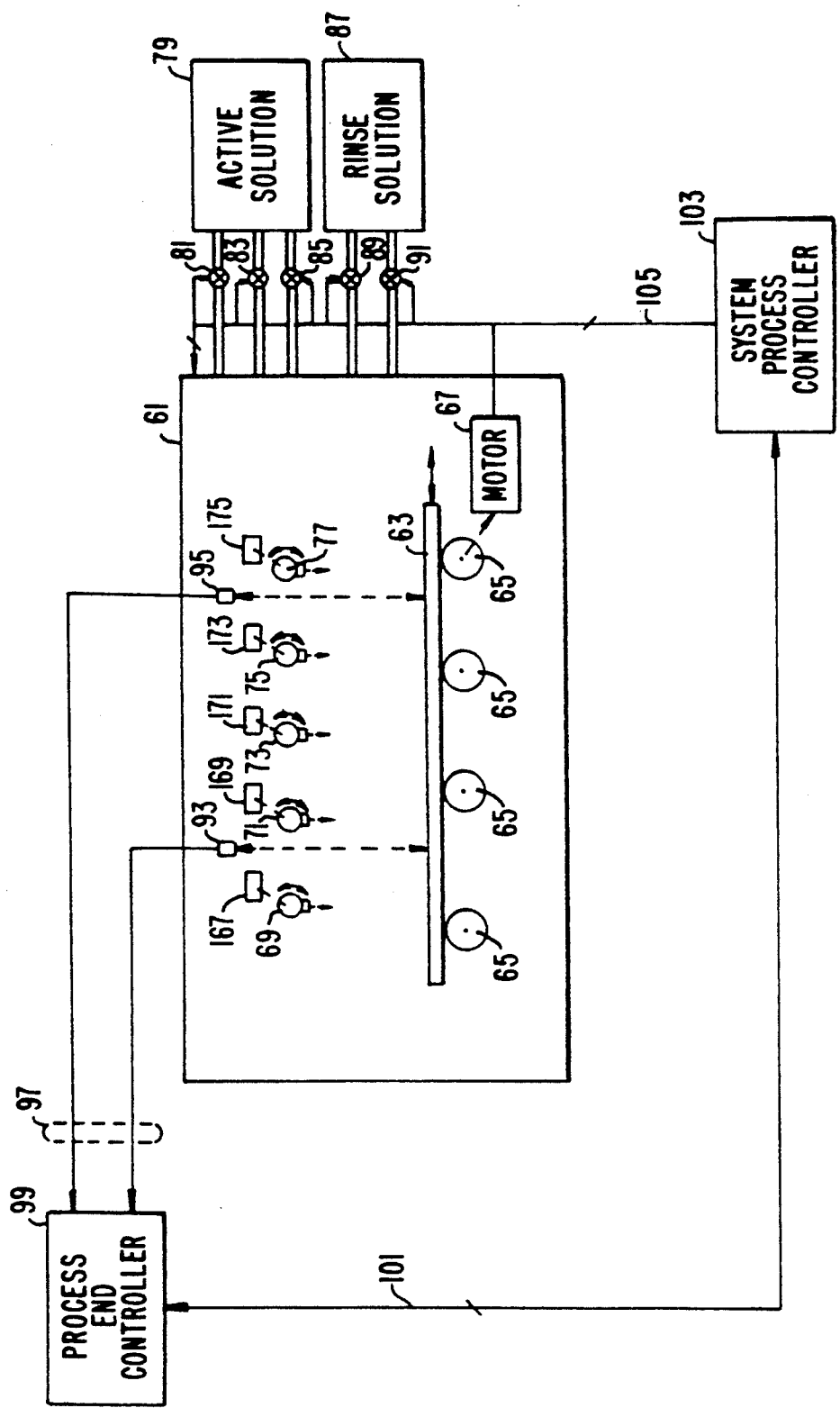
FIG. 2 schematically illustrates the use of a second type of equipment for performing substantially the same process step as the equipment of FIG. 1.

Before discussing further details of the operation of the system of FIG. 1, use of a different type of system for the same processing is described with respect of FIG. 2. An enclosed chamber 61 carries a flat panel display or large semiconductor wafer 63 on a series of rollers 65. A motor 67 drives the rollers 65 in order to move the article 63 back and forth during processing. At least several liquid conduits 69, 71, 73, 75 and 77 extend across the article 63 in one direction above it. Each of these conduits contains nozzles periodically spaced along the length for directing either developer solution or rinse solution onto the top surface of the panel or wafer 63. Three of these conduits, for example, can be supplied from a reservoir 79 of developer solution through individual electrically controlled valves 81, 83 and 85. Similarly, the remaining two conduits can be supplied by a rinse solution from a reservoir 87 through individual electrically controlled valves 89 and 91.

Although the liquids are illustrated to be applied to the photoresist layer by spray, other techniques are also used with which the techniques of the present invention may be used. One alternative is to pour the liquid onto the horizontal surface of the article. Another is to hold the articles in a vertical position within a bath of the solution.

Two photodetectors 93 and 95 are shown positioned above the article 63 at spaced apart locations. The photodetectors are connected through circuits 97 to a process end controller 99. Breakthrough of the photoresist layer in each of the regions from which light is reflected into the photodetectors 93 and 95 is also determined by the controller 99. The controller 99 then calculates a time in which the process should be terminated by stopping application of developer solution to the article 63 and commencing application of rinse solution. This process end time is communicated by circuits 101 to an overall process controlling computer 103. The controller 103 controls functions through signals in circuits 105, such as operation of the motor 67 and the opening and closing of the valves 81, 83, 85, 89 and 91. Other control functions performed by the system controller 103 are described below.

Figure 3:
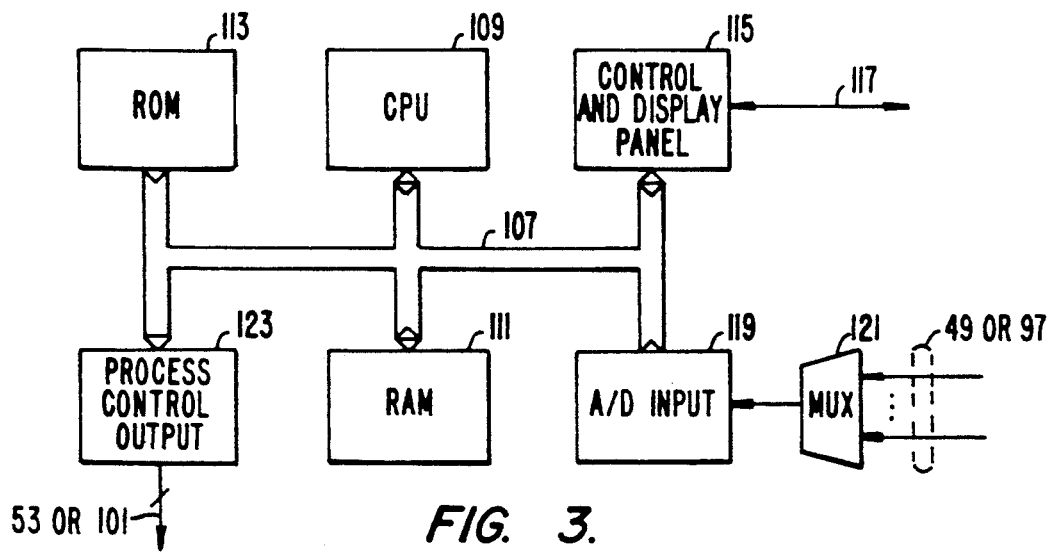
FIG. 3 is a block diagram of the process end controller used in both of the FIG. 1 and 2 systems.

A generalized block diagram for the process end controllers 51 (FIG. 1) and 99 (FIG. 2) is given in FIG. 3. Connected to an internal system bus 107 are various components found in a general or a special purpose computer. A microprocessor 109 is one of these components, as is system dynamic random access memory (RAM) 111 and a read only memory (ROM) 113. One input-output circuit 115 interfaces over a circuit 117 with a control and display panel, such as one including a cathode ray tube display and some form of push button array or keyboard input. A second input-output circuit 119 receives one of the electrical signals at a time from the plurality of photodetectors in the system, through a multiplexer 121. The multiplexer 121 is connected to the photodetector outputs 49 in the system of FIG. 1 and to the photodetector output lines 97 in the system of FIG. 2. A third input-output circuit 123 provides the process and control signal output to the system process controller by way of circuits 53 (FIG. 1 system) or 101 (FIG. 2 system). A controlling software program for operating the process end controller of FIG. 3, including the algorithms for determining when breakthrough occurs and for calculating process end time, is stored in its ROM 113 and executed by the microprocessor 109.

In order to explain the manner in which breakthrough is determined and the process end is calculated, two example signals are illustrated in curves of FIGS. 4A and 4B. Each of these curves represents an electrical signal output from a different one of the photodetectors in either of the systems of FIG. 1 or FIG. 2. As is well known, a sinusoidal oscillating signal is received as at least portions of the photoresist layer are removed during the development process. This is because the layer is substantially transparent and each photodetector generates a varying electrical output corresponding to interference maxima and minima of light from the top and bottom photoresist layer surfaces of areas being removed during the development process. A time $t_S$ is meant to indicate a time shortly after developer solution has first been applied to the exposed photoresist layer in either of the systems 1 or 2.

Figure 4:
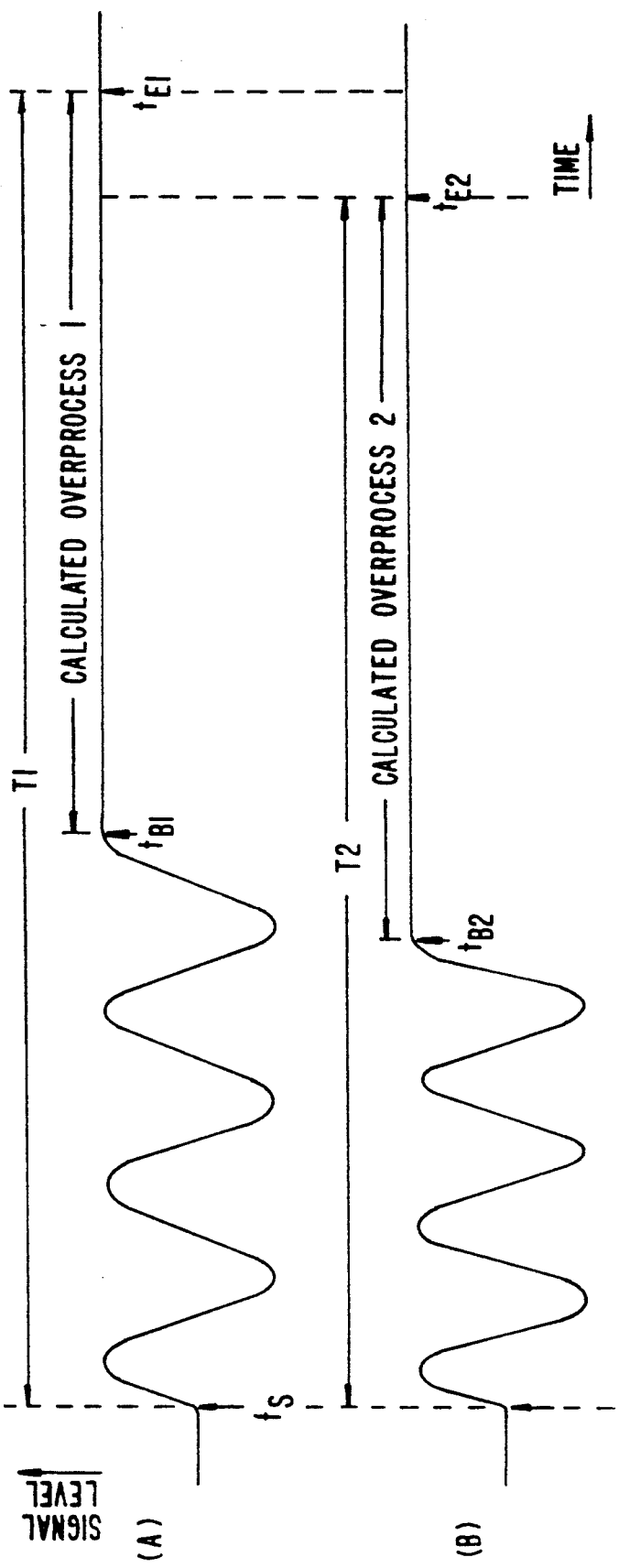
FIGS. 4A and 4B are waveforms that illustrate the detection of the end of a process accomplished by use of the equipment illustrated in either of FIGS. 1 or 2.

As at least the pattern regions are removed, the photodetector signals oscillate as indicated in FIG. 4 until there is an initial breakthrough of the layer in which the oscillation stops. For the photodetector signal of FIG. 4A, that time is noted as $t_{B1}$. For the separate photodetector signal of FIG. 4B, that breakthrough time is indicated as $t_{B2}$. The signals are shown in exaggerated form to be different from one another in order to illustrate the effect of different photoresist development times in the different regions of the photoresist surface being monitored by the photodetectors generating those signals. From these different breakthrough times $t_{B1}$ and $t_{B2}$, the process end controller 51 (FIG. 1) or 99 (FIG. 2) calculates either a process end time $t_{E1}$ or $t_{E2}$, as indicated no FIG. 4, and terminates the processing at one of those times. Although there can be significant differences in breakthrough times in the different regions being monitored, a single process end time must be calculated for use by the respective system process controller 55 (FIG. 1) or 103 (FIG. 2).

The endpoint times, $t_{B1}$ and $t_{B2}$, and other endpoint times when more than two photodetectors are utilized, are individually determined by the process end controller of FIG. 3. One such technique termed the "windowing" technique, is utilized in wet process endpoint controller model numbers 2200, 2300 and 2400, available from the Xinix division of Luxtron Corporation, Santa Clara, Calif. The windowing technique utilized in these controllers is described in its product literature. An alternate way of determining breakthrough is described in a patent application of Herbert E. Litvak, entitled "Endpoint Detection Technique Using Signal Slope Determinations," filed concurrently herewith. The disclosure of this product literature and co-pending patent application are incorporated herein by this reference.

However, when separate breakthrough times are determined to exist for the different regions of the photoresist layer being monitored, it then must be determined how these different breakthrough times are to be used to calculate a single time at which the process step is to be terminated (process end time). Systems utilizing a single photodetector add an overprocess time to the single breakthrough time in order to determine when the process should be terminated. For example, with respect to FIG. 4A, an overprocess time is added to the breakthrough time $t_{B1}$ in order to arrive at a process end time $t_{E1}$. This overprocess time is often a fixed time that is determined from experience to be required to fully complete the photoresist development after breakthrough is first determined to exist. Alternatively, a predetermined percentage of the process time between its start $t_S$ and breakthrough $t_{B1}$ is added to the time at $t_{B1}$ as the overprocess time to determine when the process and $t_{E1}$ should occur. But with different regions having different breakthrough times, all of the breakthrough times are monitored in order to calculate an overprocess time. This is preferred to the case of simply picking one of the photodetectors and calculating a process end time as if it were the only photodetector being utilized, the outputs of the other photodetectors then simply being used to provide an indication of uniformity.

One specific technique is to wait until the last region (the latest in time relative to the process start) being monitored has reached breakthrough. In the case of FIG. 4, that region is the article region from which the photodetector signal of FIG. 4A is obtained. The process end time is thus established to be $t_{E1}$. One of the usual overprocessing time determinations is made and added to that breakthrough time, in this case $t_{B1}$. This has the advantage that all regions across the photoresist layer are at least fully developed, although some will be somewhat overdeveloped.

In applications where overdevelopment cannot be tolerated, however, the first region to reach breakthrough is used to calculate the process endpoint, such as the time $t_{B2}$ of FIG. 4B. The process end time is thus established to be $t_{E2}$, in this case. The regions of the photoresist other than that of the photodetector of FIG. 4B will be somewhat underdeveloped.

As yet another alternative, some composite breakthrough time can be computed from each of the individual breakthrough times, such as by taking a simple arithmetic average. An overprocess time is then added onto this average breakthrough time in order to determine the process end time. A variation of the averaging technique is to exclude from use in the average any breakthrough times that are considerably different than those of the other regions. Many such possibilities exist for different specific circumstances when the breakthrough times of all of the photoresist regions being monitored are being taken into account.

Although the examples so far have been described with respect to the photoresist development process, the same techniques are applied to etching process steps as part of manufacturing flat panel displays or large integrated circuit wafers. In both cases, a pattered area of the layer is being removed. The techniques also apply to situations where all of a particular layer is removed.

There are many situations where the oscillating signals illustrated in FIG. 4 will not exist but rather some other form of signal is utilized to detect endpoint. If the layer being removed is not transparent, an oscillating signal will not occur but rather the photodetector output will change in level rather rapidly at breakthrough, either going up or down depending upon the relative levels of the reflectivity of the layer being removed and the underlying layer. The same considerations apply with these signals as were discussed with respect to the signals of FIG. 4, namely the use of different breakthrough times observed in different regions of a surface being removed in part or whole. The same considerations as discussed with FIG. 4 apply to these different situations as well.

Figure 5:
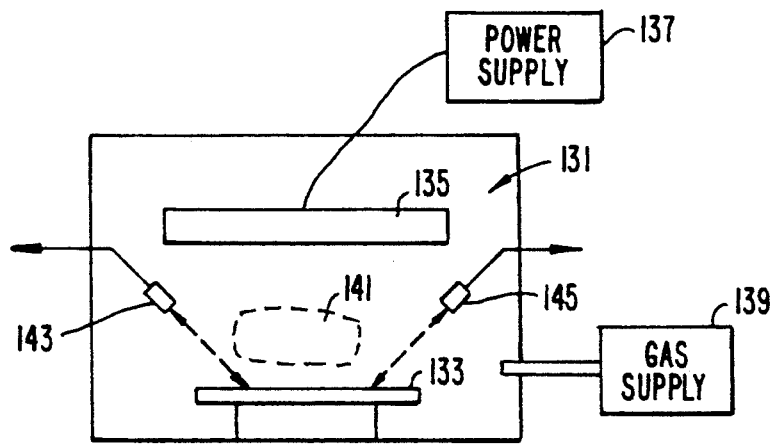
FIG. 5 schematically illustrates yet another type of processing equipment in which the present invention may be utilized.

Etching is commonly accomplished by use of a liquid etchant in the same way as photoresist development is accomplished by a liquid developer. A dry etching process is also commonly used, material being removed by a dry plasma process. FIG. 5 generally illustrates application of a present invention to a plasm etching process. Within a vacuum chamber 131 is an article 133 that carries a layer of material being etched. The article 133 can be a flat panel display or integrated circuit wafer. A target structure 135 is energized by the direct current or radio or microwave frequency power supply 137, depending on the specific process being implemented. A supply 139 of inert and reactive gases are connected to selectively supply these gases to the chamber 131. As is well known, a plasma 141 is formed over the article 133 from the breakup of gaseous molecules under the influence of strong electric fields. The result is that the exposed top layer of material on the article 133 is bombarded with ions and/or reactive neutrals that remove the entire layer, or, alternatively, if that layer is masked against such removal, only those portions of the layer defined by the mask.

In such a plasma system, two or more photodetectors 143 and 145 may be positioned to receive light reflected from different regions of the article surface. As in the prior embodiments, each of these photodetectors 143 and 145 can contain its own source of light for reflection from different regions from the article 133 and detection. Alternatively, light from the plasma 141 that is detected from the different regions being observed may be detected by the photodetectors 143 and 145. Of course, more than two separate regions may be observed by the addition of other photodetectors provided with optics to gather light reflected from those different regions.

As will readily be appreciated, significant differences in breakthrough times among the layer regions being monitored is undesirable. An indication of the uniformity of the process step can be derived from the different breakthrough times by a simple calculation. One useful indicator is to calculate an average breakthrough time of all the regions being monitored and divide that into a difference between the shortest and the longest time. This provides an indication to the process operator of the level of non-uniformity. The operator may then take steps to improve uniformity on subsequent process runs.

Such an indication of uniformity can also be automatically utilized to control the current process step or those occurring before or after the step during which the uniformity measure is being made. This is illustrated generally in a process flow diagram of FIG. 6, where an article, for the purposes of explanation, is passed through a series of distinct process steps 1, 2 and 3. It is in process step 2 where the uniformity across the article is measured and provided as an input 151 to a process control function 153 of the type including the controllers 51 and 55 of the system of FIG. 2 or controllers 99 and 103 of the system of FIG. 3. In response to the processing being indicated to be sufficiently non-uniform, changes can be made through a control path 155 in the process step 2, either in substantially real time to effect processing of the very article whose uniformity is being measured, or to adjust parameters of the process step 2 in the direction that will tend to make more uniform subsequent articles processed in that step.

Figure 6:
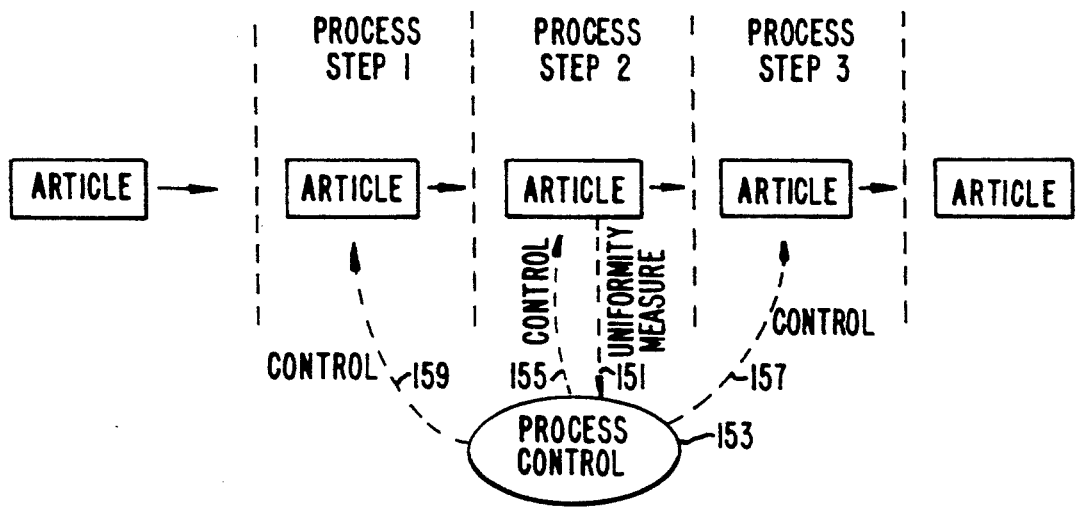
FIG. 6 illustrates use of the present invention in controlling the processing of an article by a sequence of distinct steps.

The process step 2 of FIG. 6 corresponds to the photoresist step described above with respect to FIGS. 1-5. There are many process parameters which can be changed in the systems of FIG. 1 and 2 by the respective system controllers 55 and 103. Several of these are illustrated in these figures. The temperature of a developer or etchant is controllable in the FIG. 1 system by heater/cooler units 161 and 163 that can independently control the temperature of the liquid supplied through respective nozzles 21 and 23. The temperature of the active liquid applied to different areas of the article 19 is controlled from the controller 55. Similarly, a heater 165 is indicated for heating the article itself to control the developing or etching function. The heater can be of radiant type and oriented to affect some areas of the article 19 differently than others. This also is under the control of the controller 55. Control of the motor 17 (FIG. 1) and motors 17 and 67 (FIG. 2) have already been described. In the system of FIG. 2, the extent of linear motion of the article 63 can also be controlled in addition to its speed.

Another class of process variations includes rotating the spray nozzle. Referring to FIG. 1, each of the active solution nozzles 21 and 23, and optionally, the rinse solution nozzles 31 and 33, can be made to pivot in response to signals in the control computer bus 57 to direct liquid spray to controlled areas of the spinning article 19. A similar approach can be applied in the system of FIG. 2, wherein motor sources 167, 169, 171, 173 and 175, under control of signals of the bus 105, rotate respective liquid conduits 69, 71, 73, 75 and 77 about their longitudinal axes to redirect the spray nozzles. Further, each of the spray nozzles may be individually in order to have the flow through them controlled. Thus, both the flow rate and direction of individual nozzles in the systems of FIG. 1 and FIG. 2 can be controlled. Also, the composition of the developer or etchant can be controlled by mixing two or more components of the composition in response to the signals from one of the system controllers 55 or 103.

The variables described above, and certainly others as well, can be controlled to promote uniformity of development or etching across the surface of the photoresist or other material layer. As mentioned above, one way of determining an indication of uniformity is to wait until breakthrough has been detected to have occurred in all regions and then make an adjustment required that tends to bring the breakthrough times together and thus improve the measure of uniformity. In addition, the information obtained for that article is of benefit for use in adjusting the parameters for processing the next article in that same process step 2.

Further, the photoresist development process that results in the oscillating signals of FIGS. 4A and 4B may be controlled by measuring and comparing the time periods of one or a few cycles of oscillation of the signal, before any of the monitored regions reach breakthrough. This is a measure of the level of uniformity of the processing that is taking place. The relative duration of one or more periods of the oscillating signal, which would likely be many seconds long, are then compared and any process variations necessary to make these times more uniform can be instituted.

If an undesirable non-uniformity cannot be corrected in process step 2 (FIG. 2) the information of non-uniformity may be used to control a subsequent process step 3 on the same or subsequent articles, as indicated by dashed line 157, in order to compensate for that non-uniformity. It can also be recognized that the non-uniformity determined in process step 2 may be due to non-uniformities in a prior process step 1 and thus provide information to adjust a parameter of process step 1, as indicated by a dashed line 159, so that the level of uniformity measured in the next process step 2 is better.

For example, if a process step prior to process step 2 includes the deposition of a metal layer which is then being etched in process step 2, the non-uniformity being measured in process step 2 can be due, at least in part, to a non-uniform thickness of the metal layer deposited in the prior step. Thus, the non-uniformity that is measured during process step 2 can be used to adjust the uniformity of the metal being deposited in a prior step for subsequent articles.

The examples given above relate to the removal of all or a patterned portion of a layer of material. The present invention also has application to the formation of a layer when the opacity or other optical property of the layer changes as its thickness changes. When the layer being formed is substantially transparent, an oscillating signal similar to that of FIG. 4 will be obtained. It is of course desirable to form each layer to a desired thickness uniformly across the surface. Optical monitoring of different regions across the surface allows the degree of uniformity to be observed and controlled.

Although the various aspects of the present invention have been described with respect to preferred embodiments thereof, it will be understood that the invention is entitled to protection within the full scope of the appended claims.

It is claimed:

1. In a process of removing a layer of material across at least a portion of a surface thereof by contacting at least said surface portion with a material removing substance, a method of monitoring the material removal process, comprising the steps of:
   separately monitoring removal of material from the layer in each of at least two separate regions across the layer surface,
   separately determining when a breakthrough of the layer occurs in each of said regions, and
   providing an indication when it is determined that breakthrough has occurred in a predetermined number of said regions.

2. The method of claim 1 wherein the indication providing step includes providing said indication in response to a determination that breakthrough has occurred in any one of said regions.

3. The method of claim wherein the indication providing step includes providing said indication in response to a determination that breakthrough has occurred in all of said regions.

4. The method of claim 1 which includes an additional step of determining an indication of uniformity of material removal among said regions from results of the monitoring step.

5. The method of claim 1 which includes an additional step of determining an indication of uniformity of material removal among said regions from a time difference of breakthrough among the regions as obtained during the breakthrough determining step.

6. The method of claim 1 wherein the monitoring step includes monitoring exactly four separate regions.

7. The method of claim wherein the monitoring method occurs in a process wherein the material removing substance is a liquid.

8. The method of claim wherein the monitoring method occurs in a process wherein the material removing substance is a plasma.

9. In a multi-step process of forming a given multi-layer structure on a plurality of articles in time sequence, a method of controlling the process comprising the steps of:
   measuring uniformity across a surface while one step of the process is being performed on one of the articles, wherein said uniformity measuring step includes the step of separately monitoring at least two separate regions across said surface to determine when breakthrough has occurred in each of said regions;

comparing the monitored uniformity with a standard to determine whether the degree of uniformity is within preset limits; and if the degree of uniformity is not within preset limits, modifying the process.

10. The process according to claim 9 wherein the step of modifying the process includes modifying the one process step while the uniformity is being monitored.

11. The process according to claim 9 wherein the step of modifying the process includes modifying a subsequent process step on the same article in order to compensate for an unacceptable degree of uniformity on that article.

12. The process according to claim 9 wherein the step of modifying the process includes modifying the one process step on a subsequently processed article.

13. The process according to claim 9 wherein the step of modifying the process includes modifying a prior process step on a subsequently processed article.

14. A process of removing material from a layer across at least a portion of a surface thereof, comprising the steps of:

subjecting said at least a portion of the layer surface to a material removing substance, directing electromagnetic energy to said layer in a manner to illuminate a plurality of separate regions across said layer surface, separately detecting for each of said regions a characteristic of said electromagnetic energy after interaction with the layer, thereby generating a separate electrical signal for each surface layer region, monitoring each of said electrical signals to separately determine when a breakthrough of said layer occurs in each of said layer surface regions, providing an indication when it is determined that breakthrough has occurred in a predetermined number of said regions, and terminating the material removal process in response to said indication having been provided.

15. The method of claim 14 wherein the indication providing step includes providing said indication in response to a determination that breakthrough has occurred in any one of said layer surface regions.

16. The method of claim 14 wherein the indication providing step includes providing said indication in response to a determination that breakthrough has occurred in all of said layer surface regions.

17. A method of processing an article, comprising the steps of:

(a) removing at least a portion of a layer carried by an article and monitoring this removal, by a method including the steps of:

applying a material removal substance to a surface of said at least a portion of said layer, directing electromagnetic energy to said layer in a manner to illuminate a plurality of separate regions across said layer surface, separately detecting for each of said regions a characteristic of said electromagnetic energy after interaction with the layer, thereby generating a separate electrical signal for each surface layer region, monitoring each of said electrical signals to separately determine when a breakthrough of said layer occurs in each of said layer surface regions, and determining from said electrical signals a measure of uniformity of material removal among said regions of said layer surface, and (b) adjusting process of said article in response to said uniformity measure.

18. The method of claim 17 wherein the uniformity measure determining step includes, after breakthrough has been determined to have occurred in all of said regions, the step of providing an indication of uniformity of material removal across said layer surface from relative times that breakthroughs of said individual regions were determined to have occurred.

19. The method of claim 17 wherein the processing adjusting step includes making an adjustment to the substance applying step.

20. The method of claim 17 wherein the processing adjusting step is accomplished in a manner to improve the measure of uniformity on the article being processed.

21. The method of claim 17 wherein the processing adjusting step is accomplished in a subsequent processing step on the same article.

22. The process according to claim 9 wherein the step of modifying the process includes modifying a subsequent process step on a subsequently processed article.

23. The method of claim 1 further comprising the step of terminating the material removal process in response to said indication having been provided.

24. The method of claim 1 wherein said indication providing step includes the step of calculating an over-process time which is related to a predetermined percentage of an amount of processing time required to achieve a first breakthrough in any one of said regions.

25. The method of claim 1 wherein the indication providing step includes providing said indication after a determination that a composite breakthrough time has elapsed, said composite breakthrough time being equal to an arithmetic average of all breakthrough times of a previously processed article.

26. The method of claim 14 wherein said indication providing step includes the step of calculating an over-process time which is related to a predetermined percentage of an amount of processing time required to achieve a first breakthrough in any one of said regions.

27. The method of claim 14 wherein the indication providing step includes providing said indication after a determination that a composite breakthrough time has elapsed, said composite breakthrough time being equal to an arithmetic average of al breakthrough times of a previously processed surface.

28. The method of claim 17 wherein said uniformity determining step includes the step of comparing relative durations of an equal number of oscillations of each of said signals before any of said regions reach breakthrough, thereby determining the relative uniformity of material removal among said regions.

29. In a multi-step process of forming a given multilayer structure on a plurality of articles in time sequence, a method of controlling the process comprising the steps of:

measuring uniformity across a surface while one step of the process is being performed on one of the articles, wherein said uniformity measuring step includes the step of separately monitoring at least two separate regions across said surface, comparing the monitored uniformity with a standard to determine whether the degree of uniformity is within preset limits, and if the degree of uniformity is not within preset limits, modifying a subsequent process step on the same article in order to compensate for an unacceptable degree of uniformity on that article.

30. In a multi-step process of forming a given multilayer structure on a plurality of articles in time sequence, a method of controlling the process comprising the steps of:

measuring uniformity across a surface while one step of the process is being performed on one of the articles, wherein said uniformity measuring step includes the step of separately monitoring at least two separate regions across said surface, comparing the monitored uniformity with a standard to determine whether the degree of uniformity is within preset limits, and if the degree of uniformity is not within preset limits, modifying the one process step on a subsequently processed article.

31. In a multi-step process of forming a given multilayer structure on a plurality of articles in time sequence, a method of controlling the process comprising the steps of:

measuring uniformity across a surface while one step of the process is being performed on one of the articles, wherein said uniformity measuring step includes the step of separately monitoring at least two separate regions across said surface, comparing the monitored uniformity with a standard to determine whether the degree of uniformity is within preset limits, and if the degree of uniformity is not within preset limits, modifying a prior process step on a subsequently processed article.

32. In a multi-step process of forming a given multilayer structure on a plurality of articles in time sequence, a method of controlling the process comprising the steps of:

measuring uniformity across a surface while one step of the process is being performed on one of the articles, wherein said uniformity measuring step includes the step of separately monitoring at least two separate regions across said surface, calculating an overprocess time based upon results of said uniformity measuring step, said over process time being sufficiently long to ensure that breakthrough has been achieved across at least a portion of said surface, and terminating said process at the end of said overprocess time.

33. The method of claim 32 wherein said uniformity measuring step includes the steps of:

detecting a separate interference pattern from each of said at least two monitored regions, and comparing at least two of said separate interference patterns in order to measure the relative uniformity of material removal among said regions.

34. In a multi-step wet etching process of forming a given multi-layer structure on a plurality of articles in time sequence, a method of controlling the process comprising the steps of:

measuring uniformity across a surface while one step of the wet etching process is being performed on one of the articles, said uniformity measuring step including the step of separately monitoring removal of material from said surface in each of at least two separate regions across said surface, comparing the monitored uniformity with a standard to determine whether the degree of uniformity is within preset limits, and if the degree of uniformity is not within preset limits, modifying the wet etching process.

* * * * *

UNITED STATES PATENT AND TRADEMARK OFFICE
CERTIFICATE OF CORRECTION

PATENT NO. : 5,308,447
DATED : May 3, 1994
INVENTOR(S) : Lewis et al.

It is certified that error appears in the above-indentified patent and that said Letters Patent is hereby corrected as shown below:

In Column 10, lines 51 and 54 in Claims 7 and 8:
    replace "The method of claim wherein"
    with --The method of claim 1 wherein--

In Column 12, line 1, in Claim 17:
    replace "adjusting process of said article"
    with --adjusting processing of said article--

In Column 12, line 47, in Claim 27:
    replace "average of al breakthrough times"
    with --average of all breakthrough times--

Signed and Sealed this

Twentieth Day of September, 1994

Attest:

BRUCE LEHMAN

Attesting Officer      Commissioner of Patents and Trademarks